April 26, 1960 C. B. ACKERMAN ET AL 2,933,787

ALLOYING APPARATUS FOR TRANSISTORS

Filed Oct. 9, 1956 3 Sheets-Sheet 1

INVENTORS
CHARLES B. ACKERMAN
ROBERT M. BIRD

BY Mueller and Aichele

ATTORNEYS

ALLOYING APPARATUS FOR TRANSISTORS

Filed Oct. 9, 1956 3 Sheets-Sheet 2

INVENTORS
CHARLES B. ACKERMAN
ROBERT M. BIRD

BY Mueller and Aichele

ATTORNEYS

INVENTORS
CHARLES B. ACKERMAN
ROBERT M. BIRD
BY
Mueller and Aichele
ATTORNEYS

United States Patent Office
2,933,787
Patented Apr. 26, 1960

2,933,787

ALLOYING APPARATUS FOR TRANSISTORS

Charles B. Ackerman, Phoenix, and Robert M. Bird, Mesa, Ariz., assignors to Motorola, Inc., Chicago, Ill., a corporation of Illinois Application October 9, 1956, Serial No. 614,982

1 Claim. (Cl. 22—75)

The present invention relates generally to transistor fabrication, and more particularly to improved apparatus for expediting and improving the manufacture of the alloy junction transistor.

The alloy junction transistor comprises a semiconductor crystal wafer or die composed, for example, of germanium and which has an impurity metal alloyed into each of its opposite faces to form respective p-n junctions within the die. When the semiconductor die is of the n-type, the alloying substance is then a p-type impurity which, for example, can be an element from column III of the periodic table. However, the preferred element from that column is indium which is widely used at present because of its ability to alloy with germanium at relatively low temperatures and its ability to solidify without setting up appreciable stresses in the crystal which could crack the wafer. When p-type semiconductor crystal wafers are used, then the n-type impurity is usually chosen from the hydrogen group of the periodic table or alloys thereof. Binary tin-antimony alloy has been successfully used.

In constructing the alloy junction transistor, discs or pellets of the suitable impurity such as indium are fused to the opposite faces of a semiconductor crystal die such as, for example, a die composed of n-type germanium. The alloying of these discs to the opposite faces of the semiconductor die is usually carried out in a furnace having an inert atmosphere established therein and whose temperature is then raised to the alloying point of the indium and germanium to form the respective p-n junctions within the die. During the alloying process, the fused indium continues to alloy with the surface of the semiconductor die until the liquid indium becomes saturated with the semiconductor material at the alloying temperature. During the cooling of the assembly, the semiconductor contained in the liquid indium is precipitated on the semiconductor die carrying with it some alloying metal. This produces recrystallized p-type regions within the n-type crystal, with p-n junctions between the recrystallized regions and the remainder of the crystal die.

It was usual in the prior art to alloy each of the electrodes in succession. That is, a first disc was usually placed on one side of the semiconductor die and alloyed thereto to form the emitter junction, and a second disc was then placed on the opposite side of the die and alloyed thereto to form the collector junction. This succession of steps was considered necessary to assure that both discs would be coaxial and directly opposite one another, this being essential for satisfactory electrical characteristics in the final transistor. However, difficulties were encountered, not only in the inherent awkwardness due to the excessive manipulation required of the minute germanium die and the even smaller indium pellets, but also it was found that the two firing or alloying steps were not desirable because the second alloying step had a tendency to melt the junction formed by the first step creating the possibility of excessive undesired diffusion of the first junction.

It has been proposed in the past to fuse and alloy the impurity spheres to the opposite sides of the semiconductor die in one step. This involved the use of a molding jig or boat which supported the semiconductor die in an upright or vertical position, and which had notches formed therein for holding a pair of pellets of the impurity against the opposite sides of the wafer so that the two impurity pellets would be fused to the wafer when the assembly was passed through the heat zone. It was also suggested that the boats be designed to support a plurality of wafer-pellet assemblies so that many such assemblies could be alloyed in one heating operation.

It has also been proposed prior to this invention to provide an assembly jig or boat which also permits impurity metal discs to be fired simultaneously to the opposite sides of the semiconductor die. Such a boat is designed so that the impurity discs are constrained in all directions when they become molten during the firing operation to accurately control the configuration of the recrystallized zones so as to provide relatively large areas and shallow penetration for these zones, this being desired for high power operation.

This present invention provides individual molds for each assembly of the die and impurity discs; which molds hold the impurity discs in a manner fully to constrain them when in a molten condition and to control fully the area wet thereby and the penetration thereof. Moreover, each of the individual molds or boats of this invention supports the die and discs for simultaneous firing thereof as each boat passes through the heat zone, and the invention provides uniform alloying conditions for each jig advanced through the heat zone.

It is an object of the present invention to provide improved apparatus for use in the fabrication of alloyed junction transistors, and which apparatus permits a continuous alloying operation to be made on successive impurity disc-semiconductor die assemblies on a mass production basis.

Another object of the invention is to provide an automatic feed for an alloying furnace.

A further object of the invention is to provide an alloying furnace in which temperatures therealong are precisely controlled.

One feature of the invention is the provision of a vertical transistor alloying furnace having a magazine for feeding molds into the furnace.

Another feature of the invention is the provision of an alloying furnace having end portions of reduced area to reduce conduction of heat along the end portions of the furnace.

A further feature of the invention is the provision of a vertical tube member in a furnace mounted coaxially therewith to produce a heat zone within the tube, and with an ejecting means at the bottom of the tube for supporting a column of individual molds for the die assemblies in stacked relation in the tube and for individually ejecting the molds. A tubular magazine on the top of the tube supplies molds to the tube, and the tube is surrounded by a thick-walled tubular heating member having grooves in the ends thereof to reduce the flow of heat therethrough.

Referring now to the drawings.

The invention is embodied in apparatus for producing alloyed junction transistors, and the like, by means of a plurality of individual but vertically stacked jigs which move through a space which is controlled as to heat and atmosphere for the best alloying of junction pellets to form discs as junctions on each side of a semiconductor die. Each jig has a die and two pellets or discs therewith on opposite sides of the die. A magazine stacks the jigs vertically, and a furnace unit surrounds the frame and provides heat to the semiconductor and junction pellets preassembled into the jigs. The weight of the vertically stacked jigs provides a force exerted downwardly to hold the stack against a rotatable cam supported at the bottom of the frame means. As the cam rotates, it ejects the lowermost one of the molds from the retained stack with each revolution of the cam. In this manner the column of jigs or molds moves down through the heat zone, and each is ejected as it is engaged by the cam at the bottom of the frame.

The force of gravity on the stacked jigs or molds is sufficient to hold each jig and its contained pieces as an assembly in the proper relationship so that it is unnecessary to employ clamps, or screws, or the like for retaining the assembly in position. This simplifies the apparatus and the act of assembly, and provides an improved construction.

Figure 1:
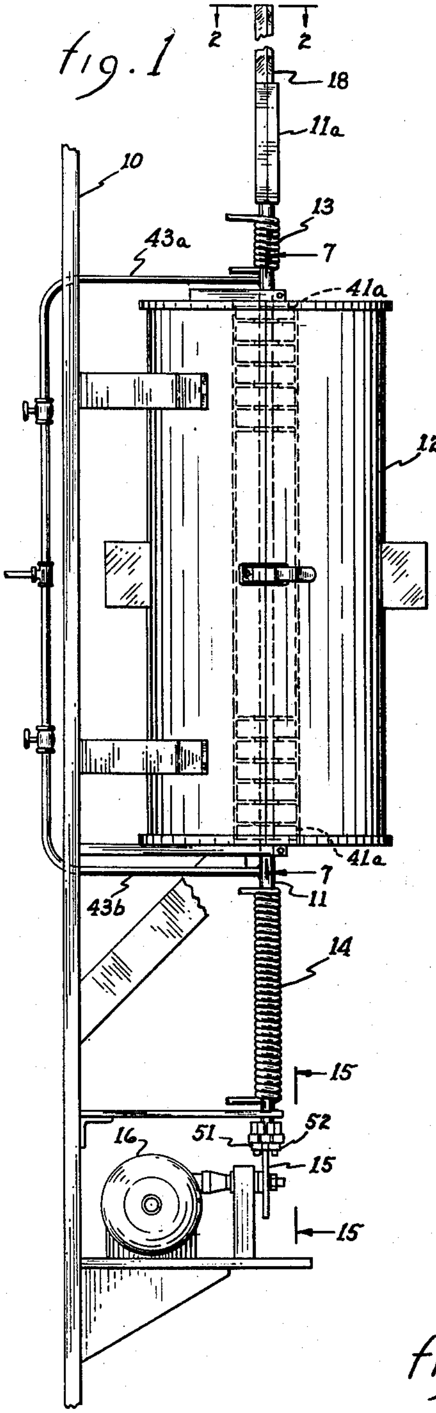
Fig. 1 is an elevational view of a vertical alloying furnace of the invention.
Figure 2:
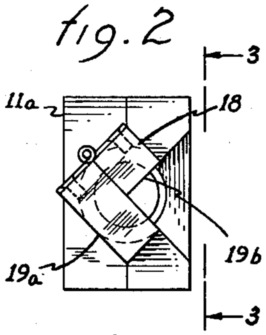
Fig. 2 is a top view taken along the line 2—2 of Fig. 1.
Figure 4:
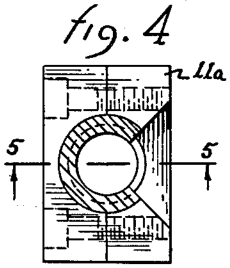
Fig. 4 is a cross-sectional view taken along the line 4—4 of Fig. 3.
Figure 5:
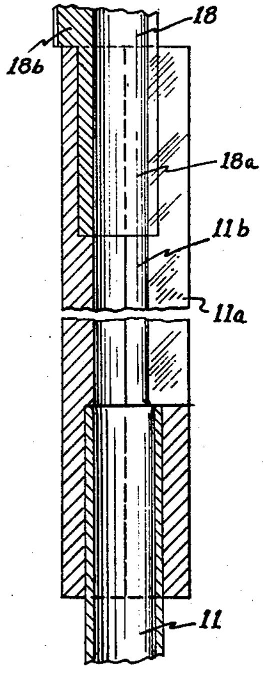
Fig. 5 is a sectional view taken along the line 5—5 of Fig. 4.
Figure 3:
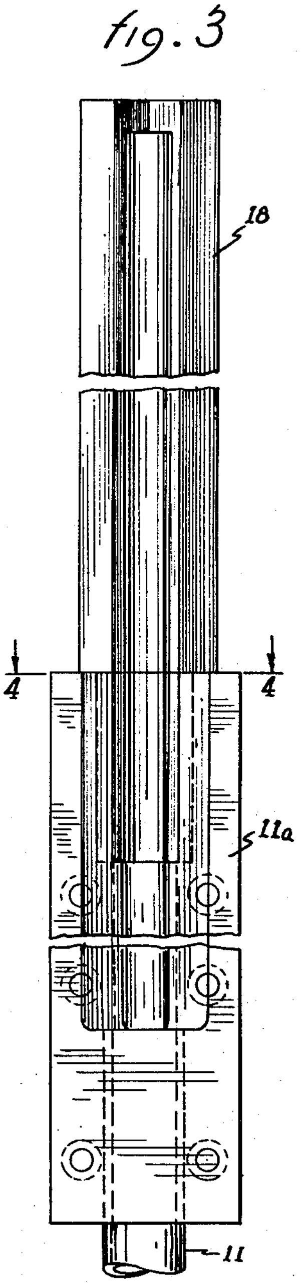
Fig. 3 is a side view of an upper portion of the apparatus taken along the line 3—3 of Fig. 2.
Figure 6:
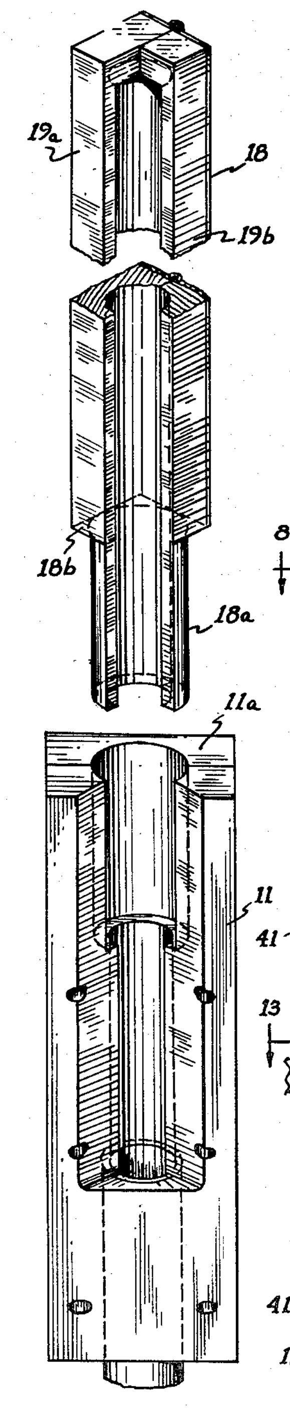
Fig. 6 is an exploded perspective of the position of apparatus shown in Fig. 3.

Referring now to the drawings, the apparatus of Fig. 1 includes a frame 10 which supports a tubular member 11 with its longitudinal axis extending in a vertical direction. The frame also supports a furnace 12 which may be of any usual construction using, for example, electrical heating elements. The furnace 12 is supported coaxially with the tubular member 11, and it extends axially thereof over a portion of the length of the tubular member to produce a heat zone therein. A coil 13 is wrapped around the upper end of the tubular member 11, and a coolant may be passed through this coil to bring the mold elements to a precise starting temperature just before they enter the heating zone. A second coil 14 is wrapped around the lower portion of the tubular member and a coolant such as water may be passed through this coil to provide cooling for the molds emerging from the heat zone created by furnace 12. This latter coil cools the mold elements and contents to a predetermined temperature just after they leave the furnace.

As previously noted, a series of individual molds pass down through the tubular member 11 and through the heat zone of furnace 12, and these molds are supported in a stacked condition by the periphery of cam 15. The cam is supported in a vertical plane at the bottom of the tubular member and is rotated about a horizontal axis by a drive motor 16. The tubular member 11 has a slotted portion 17 at its bottom, and the cam 15 passes between the legs of slotted portion 17. The molds referred to above are introduced into the tubular member by a cartridge or magazine 18 that can be slipped into the top portion 11*a* of the tubular member.

As more clearly shown in Figs. 2–5, the cartridge 18 has a protruding bottom or trough portion 18*a* which may conveniently be inserted into the top portion 11*a* of the tubular member 11, and the cartridge also has a radially protruding portion or shoulder 18*b* which seats on the top of the tubular member 11. With this construction, an operator merely takes a cartridge which has previously been filled while lying on its side with a stack of molds, and inserts the cartridge into the top of the top portion 11*a* of the tubular member to allow the molds therein to move by gravity down into the bore 11*b* of the tubular member. When the cartridge is empty, it may be removed and replaced by a full cartridge. In this manner, a continuous flow of molds may be maintained down through the bore 11*b* of the tubular member 11. The magazine 18 comprises a body portion 19*a* and a cover 19*b* hinged thereto. The cover may be opened to facilitate loading molds into the magazine.

Figure 7:
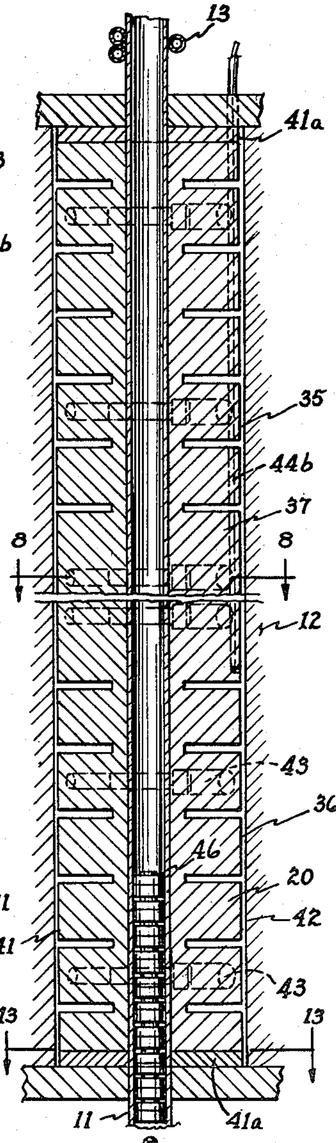
Fig. 7 is a sectional view taken along the line 7—7 of Fig.1.
Figure 8:
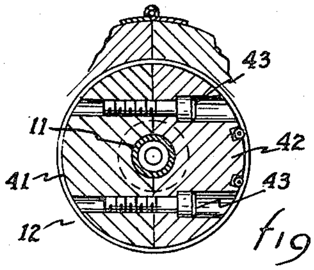
Fig. 8 is a cross-sectional view taken along the line 8—8 of Fig. 7.
Figure 9:
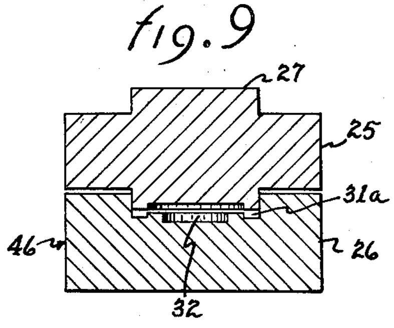
Fig. 9 is a sectional view of the boat suitable for use in conjunction with the apparatus of the invention.
Figure 10:
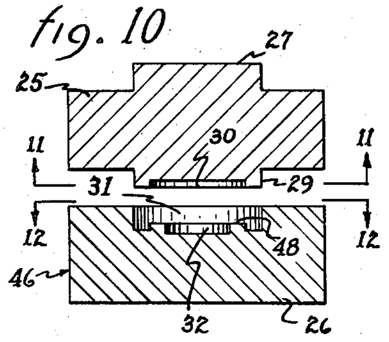
Fig. 10 is a view of the boat with its two sections separated.
Figure 11:
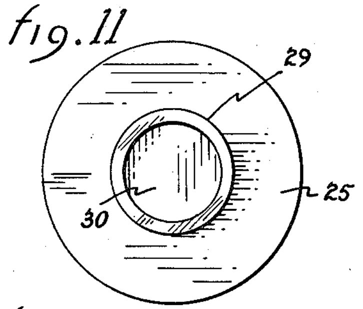
Fig. 11 is a bottom view of the top section of the boat taken along the line 11—11 of Fig. 10.
Figure 12:
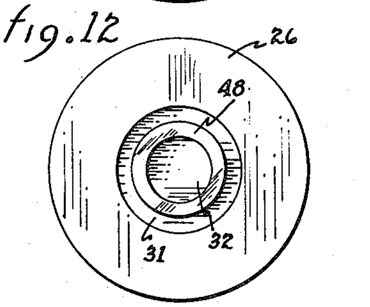
Fig. 12 is a top view of the bottom section of the boat taken along the line 12—12 of Fig. 10.
Figure 14:
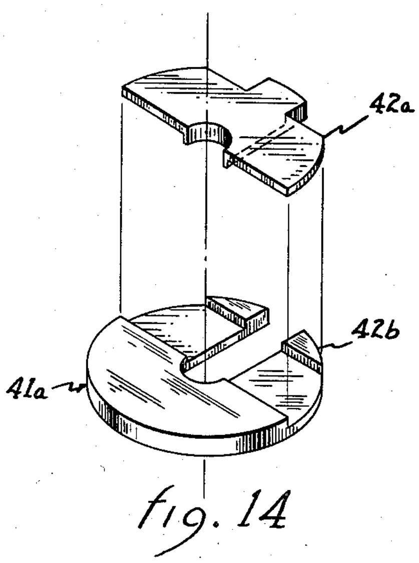
Fig. 14 is an exploded, perspective view of a portion of the apparatus shown in Fig. 13.
Figure 13:
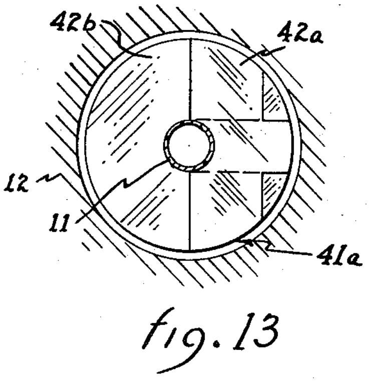
Fig. 13 is a sectional view taken along line 13—13 of Fig. 7.
Figure 16:
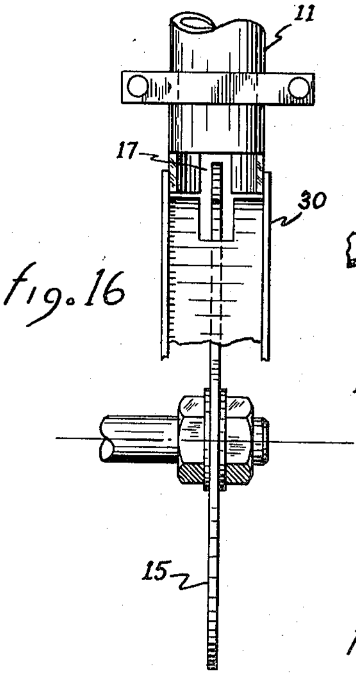
Fig. 16 is a view taken along line 16—16 of Fig. 15.

The interior of the furnace member is shown in Fig. 7, with Fig. 8 showing the enlarged detailed section of a portion of that member. It may comprise, for example, a thick-walled tube or liner 20 of a suitable thermal conductor such as graphite. The tube 20 is supported within the furnace 12 in the vicinity of the heat zone with slotted end portions 35 and 36 extending beyond the heat zone of the furnace to provide minimum cross-sectional area to cut down thermal conductivity along the end portions of tubular member 11. Toward the center of the furnace or heated portion of member 11, a solid or unslotted portion 37 of the graphite tube 20 is provided. The purpose of using the relatively large mass of heat-conducting material is to provide even distribution of heat in the tubular member 11, and the slotted end portions reduce conductivity away from central heating zone. The tube 20 is made up from two thick-walled grooved semi-cylinders 41 and 42 secured together by bolts 43. Discs 41*a* of heat-insulating material such as, for example, asbestos cement, are positioned at the ends of the tube 20 and have interlocking segments 42*a* and 42*b*. Supply pipes 43*a* and 43*b* are provided to supply an inert gas such as, for example, argon, to the interior of the furnace, and a hole 44*b* also is provided to permit insertion of a thermocouple from the top to locate heat zones in the furnace.

Individual molds 46 for each of the semiconductor-impurity pellet combinations are shown in Figs. 9–12. As shown in these figures, the molds are generally cylindrical in shape and comprise an upper section 25 and a lower section 26. A raised platform 27 is formed on the upper section to separate the molds and cut down thermal conductivity therebetween. The upper mold section has a protruding portion 29 on its lower surface which has a pit 30 formed therein, and the lower section 26 has a cylindrical depression 31 formed in its upper surface with a pit 32 at the bottom of the depression. The section 26 also has an outer annual groove 31*a*. One of the impurity discs is placed in the pit 32, a tin ring is placed in the groove 31*a*. The wafer is then placed across the top of that pit and the groove 31*a* over a separating wall 48 and the other impurity disc is positioned in a pit 30 and held against the opposite side of the wafer when the two sections are brought together. In this manner, each individual mold holds a wafer-impurity assembly in position for firing.

Figure 15:
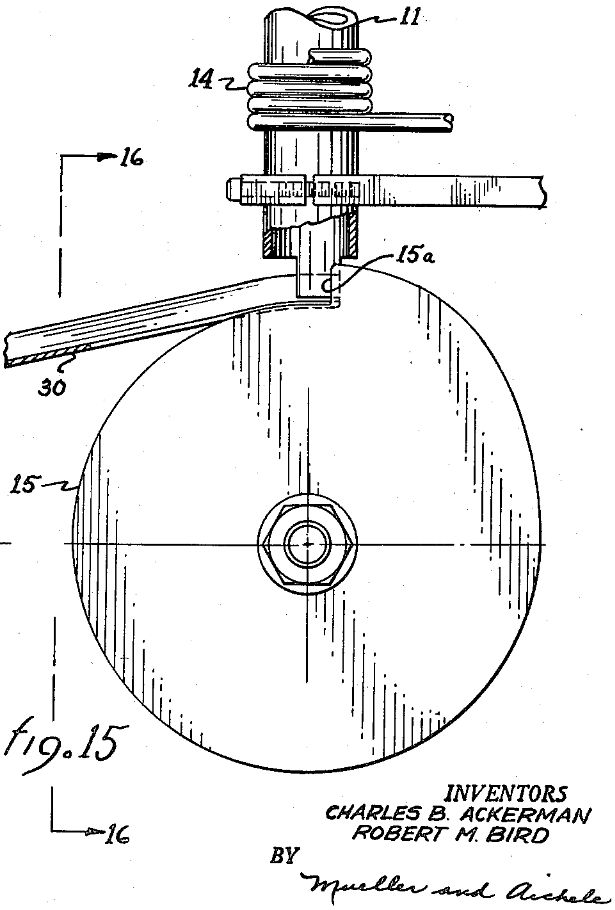
Fig. 15 is an enlarged elevation taken along line 15—15 of Fig. 1.

The molds are held in a stacked column in the bore 11*b* of the tubular member 11 by the cam 15. An enlarged side view of the cam is shown in Fig. 15, and it has a radial projection or shoulder 15*a* which ejects the lowermost mold from the bottom of the stack of molds and sends the ejected mold down a chute 30 where it may be picked up by a belt or other means for further processing. Until pushed by the cam 15, the lowermost mold is retained in the stack or column by friction of the mold thereabove.

In accordance with the invention, therefore, the wafer-impurity assemblies are each mounted in the molds 25, 26, and these molds are placed in the cartridge 18. The cartridge is slipped into place and the bore **11*b* of the tubular member 11 is filled with the molds, these being held in stacked relation in the bore by the periphery of cam 15. The furnace 12 establishes a heat zone in the tubular member and rotation of the cam 15 causes its projecting member 15*a* to push the lowermost mold into chute 30. This establishes a continuous flow of molds at a uniform rate of speed down through the entrance cooling zone, the heat zone established by furnace 12**, and the exit cooling zone to produce the alloyed impurity-semiconductor assemblies. Thus, each mold with its contents is subjected to conditions identical with those to which each other mold is subjected so that fusing of the electrodes to the wafers is very uniform.

The invention provides, therefore, a simple and improved apparatus that is relatively uncomplicated in its construction, and which permits the production of alloyed junction semiconductor wafers to be placed on a continuous mass-production basis.

We claim:

Apparatus for the continuous production of semiconductor die units which comprise a semiconductor die having a metallic electrode alloyed thereto, said apparatus including in combination, a cylindrical furnace member having a vertical opening therethrough, a central metallic tube coaxial with said furnace member and extending through the opening, said central tube having an upper portion forming a socket, an elongated magazine having a tubular end portion adapted to fit into the socket and a shoulder portion adapted to rest on the top of the upper portion of said central tube with said magazine inserted in the socket, said magazine being readily removable from the socket and including means forming a central bore which is coaxial with the bore of said central tube with said magazine inserted in the socket, the bores of said magazine and said tube adapted to accommodate a stack of two-piece mold units each containing the components of said semiconductor die unit, said magazine further comprising a longitudinally extending body portion and a longitudinally extending hinged cover portion to facilitate loading of mold units into said magazine when detached from said socket, a relatively thick walled cylindrical liner of heat conducting material fitting around said central tube and within said furnace member, means forming radial slots adjacent the ends of said liner with the midportion thereof being unslotted, said slotted portions effective to restrict flow of heat away from the midportion of said liner and produce uniform heat distribution therethrough along said central tube adjacent the midportion of said liner, a slotted extension at the bottom of said central tube extending beyond said furnace, a cam adapted to rotate about a horizontal axis with its edge within the slots of the extension and support a stack of mold units within said central tube with said mold units being held in closed position by the weight of the mold units above it in the stack, and means on said cam for ejecting successive mold units so that a continuous flow of units may take place from said magazine through said central tube and the heat zone of said furnace.

References Cited in the file of this patent

UNITED STATES PATENTS

| | | |
|---|---|---|
| 957,998 | Parsons | May 17, 1910 |
| 1,141,155 | Thuillier | June 1, 1915 |
| 1,691,349 | Harrington et al. | Nov. 13, 1928 |
| 2,329,188 | Denneen | Sept. 14, 1943 |
| 2,422,439 | Schwarzkopf | June 17, 1947 |
| 2,773,923 | Smith | Dec. 11, 1956 |
| 2,787,817 | Brennan | Apr. 9, 1957 |